(12) United States Patent
Frisina et al.

(10) Patent No.: US 6,271,061 B1
(45) Date of Patent: Aug. 7, 2001

(54) FABRICATION OF INSULATED GATE BIPOLAR DEVICES

(75) Inventors: Ferruccio Frisina; Leonardo Fragapane, both of Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/354,880

(22) Filed: Jul. 16, 1999

Related U.S. Application Data

(62) Division of application No. 08/984,104, filed on Dec. 3, 1997, now abandoned.

(51) Int. Cl.⁷ .................................................. H01L 21/332
(52) U.S. Cl. ......................................................... 438/138
(58) Field of Search .................................... 438/133, 135, 438/142, 151, 170, 197, 234, 309, 369, 506

(56) References Cited

U.S. PATENT DOCUMENTS

| | | | |
|---|---|---|---|
| 4,972,239 | 11/1990 | Mihara | 357/23.4 |
| 5,162,876 | 11/1992 | Kitagawa et al. | 257/138 |
| 5,326,993 | 7/1994 | Iwamuro | 257/139 |
| 5,355,003 | 10/1994 | Tomomatsu | 257/139 |
| 5,528,058 * | 6/1996 | Pike, Jr. et al. | 257/142 |
| 5,654,561 | 8/1997 | Watabe | 257/139 |
| 5,751,023 | 5/1998 | Aono | 257/138 |
| 5,793,066 | 8/1998 | Ajit | 257/152 |

FOREIGN PATENT DOCUMENTS 0 594 049 A1    4/1994   (EP) .

* cited by examiner

*Primary Examiner*—Keith Christianson
(74) *Attorney, Agent, or Firm*—Theodore E. Galanthay; Charles J. Rupnick; Seed Intellectual Property Law Group PLLC

(57) ABSTRACT

A semiconductor power device comprising an insulated gate bipolar transistor, of the type which comprises a semiconductor substrate with a first type of conductivity and an overlying epitaxial layer with a second type of conductivity, opposite from the first, and whose junction to the substrate forms the base/emitter junction of the bipolar transistor, has the junction formed by a layer of semiconductor material with conductivity of the second type but a higher concentration of dopant than that of the epitaxial layer. Furthermore, the device has the epitaxial layer with conductivity of the second type provided with at least two zones at different dopant concentrations, namely a first lower zone being part of the junction and having a higher dopant concentration, and a second upper zone having a lower concentration.

20 Claims, 10 Drawing Sheets

FABRICATION OF INSULATED GATE BIPOLAR DEVICES

CROSS-REFERENCE TO RELATED APPLICATION

This application is a divisional of pending U.S. patent application Ser. No. 08/984,104, filed Dec. 3, 1997, abandoned.

TECHNICAL FIELD

The present invention is directed to devices of the type that include insulated gate bipolar devices, commonly known as IGBTs, and modulated-conductivity MOS power devices.

More particularly, the invention relates to IGBT type devices having enhanced features of rugged construction, conductivity modulation, and speed.

BACKGROUND OF THE INVENTION

As is well known, from a functional standpoint, an IGBT type device is considered to be the equivalent of a MOSFET transistor driving a bipolar power transistor, for instance as shown in FIG. 1 of this application which is reproduced from Klaus Rischmuller's publication "PCIM90 EUROPE". Power Conversion Conference, June '90.

A description of the basics of the operation of an IGBT type of structure is given in U.S. Pat. No. 4,495,493.

A different embodiment which brings out other features of the same IGBT type device is described in U.S. Pat. No. 5,073,511.

Problems related to IGBT type devices are dealt with in Italian Patent 1241049.

From the above-referenced prior art, it can be evinced that the following are among the advantages afforded by an IGBT type device:

ruggedness, speed or relative fall time, and conductivity modulation or relative output resistance.

Also known is that conductivity modulation is dependent on the injection of minority carriers from the P+ substrate layer, designated 10 in FIG. 1, into a resistive epitaxial layer 20 of the N− type, also shown in FIG. 1.

This lowers the device output resistance accordingly.

It follows that a reduction in conductivity modulation, resulting from a reduction in the gain of transistor 60 which is a parasitic PNP transistor intrinsic to the IGBT type device and shown in FIG. 1, will in turn result in increased output resistance of the device.

Also known is that an IGBT type device has an output resistance, or VCEsat directly tied to it, which increases with the breakdown voltage of the device.

Also known is the relationship of breakdown voltage to the thickness of the epitaxial layer and its dopant concentration. This can be expressed as follows:

$$BV = [q\, C\, X^{**}2]/[2e] \quad (1)$$

where: BV is the breakdown voltage; C is the dopant concentration in the epitaxial layer; X is the actual thickness of the epitaxial layer, i.e., the overall thickness less the thickness of the deep body layer P+; q is the electron charge; and e is the dielectric constant of silicon.

Increasing the conductivity modulation of an IGBT type device and concurrently decreasing its output resistance provides a better IGBT type device.

One viable prior approach to increasing conductivity modulation used to be a decreased doping of an N+ layer 21 which corresponds to the base of the PNP parasitic transistor 60, shown in FIG. 1, so as to turn it into a high gain transistor.

However, this involves, as the skilled one will recognize, an increase in the re-combination time of the minority carriers, and this is a variable which is inversely proportional to the device "speed".

Accordingly, this first solution is only practicable on condition that a compromise can be struck, between the increase in conductivity modulation and corresponding increase in turn-off time, which represents an improvement over the basic device.

The ruggedness of a device is defined as the device ability not to destroy itself when, during a turnoff under an inductive load, it is called upon to dissipate the power related to the product of voltage by current at the crossing point of the two curves, as shown in FIG. 2.

Also referring to FIG. 1, the parasitic thyristor of the structure are made up of the two transistors 60, of the PNP type, and 61, of the NPN type.

The triggering of this parasitic thyristor at a given current value (called the latch-up current) restricts the safe range of the device.

The gain of the transistor 60 is resolutive for the control of the parasitic thyristor triggering, which in turn provides a measure of the IGBT type device ruggedness.

As previously mentioned, gain is controlled by acting on the equivalent of the base of the PNP transistor 60 that is the layer 20 shown in FIG. 1.

It follows that, to improve the ruggedness of the IGBT type device, a transistor 60 with low gain will be aimed at, e.g., by increasing the dopant dose to the N+ layer 21.

However, this manipulation of the dopant dose will act in an inversely proportional manner on the output resistance for the reasons given above in connection with conductivity modulation.

It is evident, therefore, that any improvement of the device ruggedness would be at the expense of the other significant variable, namely conductivity modulation, and vice versa.

There is another known method of acting on the output resistance, speed and ruggedness variables without altering the breakdown voltage value.

This consists selecting the thickness of the N− layer 20.

It will be recalled that it depends on breakdown voltage according to relation (1).

The thickness of the layer 20 is known, from the physics of semiconductor electronic devices, specifically of IGBTs, to be directly proportional to the re-combination time of the minority carriers.

It follows that that thickness is inversely proportional to the device speed.

In addition, by the same laws of physics, the thickness of the layer 20 is tied in a directly proportional manner to the output resistance of the device.

In light of the foregoing, it can be evinced that the conductivity modulation can be improved, or the output resistance lowered, by decreasing the thickness of the layer 20, to concurrently improve the device speed as well.

Based on relation (1), this would result in a decreased breakdown voltage.

Also according to relation (1), it would be possible to keep the same breakdown voltage by suitably reducing the thickness of the layer 20, while increasing its conductivity by a raise in the dopant dose.

While being in many ways advantageous, the last-mentioned solution has a drawback in that it implies a considerable reduction of the resultant device ruggedness due to the strong electric field which is present at the interface between the N− layer 20 and N+ layer 21.

This is also shown by the following relation (2), which expresses the electric field in the semiconductor material as a function of the thickness of the N− layer 20:

$$\frac{dE}{dX} = \frac{q \cdot C}{e} \quad (2)$$

It is evinced from this relation that a decreased thickness and concurrently increased conductivity for the layer 20 is unproposable because this would seriously impair the device ruggedness.

SUMMARY OF THE INVENTION

An object of this invention is to provide an insulated gate bipolar transistor type device with such functional and structural features as to yield improved conductivity modulation and ruggedness for the same breakdown voltage, thereby overcoming the limitations and/or drawbacks mentioned above in connection with the prior art. According to principles of the present invention, the object is obtained by a semiconductor power device of the IGBT type comprising a semiconductor substrate having a first type of conductivity and an overlying epitaxial layer having a second type of conductivity, which is opposite to the first, and whose junction to the substrate constitutes the base/emitter junction of the bipolar transistor. The layer adjacent the junction comprises a layer of a semiconductor material of said second type but having a higher dopant concentration than that of the epitaxial layer. The epitaxial layer with conductivity of the second type has at least two zones with increasing concentration, namely a first zone being adjacent to the junction layer and having a higher dopant concentration and a second zone being adjacent to the first zone and having a lower concentration.

More particularly, the invention contemplates the provision of an additional layer having a concentration intermediate those of the N− and N+ layers.

This additional layer is located between a layer of the device forming the base of the PNP transistor and a buffer layer which separates the base region from the layer forming the emitter of the PNP transistor.

Advantageously, this structure is aimed at reducing the electric field at the interface between layers of the same conductivity type of N− and N+ layers with the result of bringing it close to a zero value.

In this way, the body layer for the other circuit structures can be provided with a very high resistivity, that is less doped.

The thickness of the layer 33, therefore, can be greatly reduced while contributing, as per relation (1), toward holding the breakdown voltage of the device at the same level.

The features and advantages of the device according to the invention will appear from the following description of an embodiment thereof, given by way of example and not of limitation with reference to the accompanying drawings.

DETAILED DESCRIPTION OF THE INVENTION

FIGS. 3a to 3f illustrate, not to scale, successive steps of the process used to make an IGBT type device according to the present invention.

Figure 3A:
FIGS. 3a to 3f illustrate typical successive steps of the process to make IGBT type devices according to the present invention.
Figure 3B:
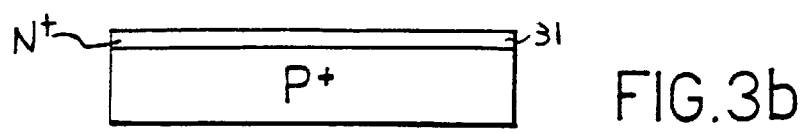
Figure 3C:
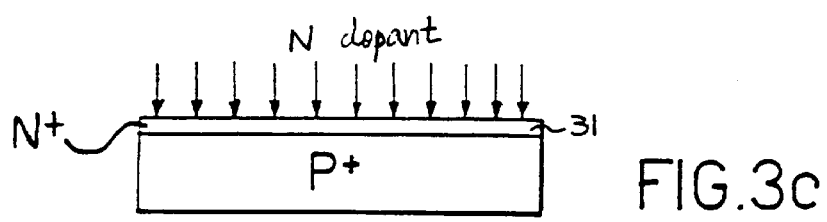
Figure 3D:
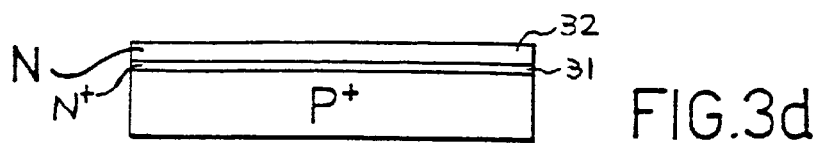

FIG. 3a shows a semiconductor substrate 10 doped heavily with a P+ type dopant as a starting step. Next, a first epitaxial layer 31 is grown of a selective conductivity in the presence of a dopant to obtain an uniformly doped layer, as shown in FIG. 3b. According to one embodiment, the dopant type is N and the concentration is in the range of 5E+16 to 1E+18 atoms/cm³. Alternatively, in a separate embodiment, the P substrate is implanted with ions of the N type to create an N+ layer 31 in an upper surface of the substrate, as shown in FIG. 3c. In this alternative embodiment, sufficient N dopant is introduced to convert the P substrate to N type having an effective concentration in the range of 5E+16 to 1E+18 atoms/cm³. Next, a second layer 32 is epitaxially grown, in the presence of a dopant, to create an uniformly doped layer, as shown in FIG. 3d. According to one embodiment, the dopant type is N and the concentration is in the range of 1E+14 to 5E+16 atoms/cm³.

Figure 3E:
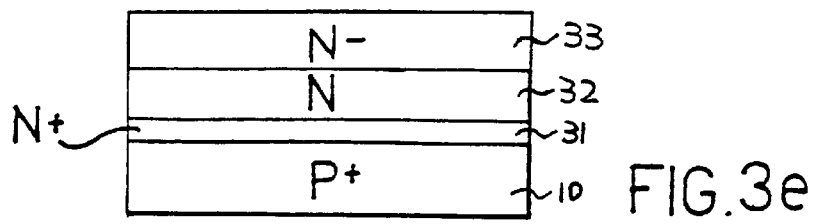

An upper layer 33 is epitaxially grown, in the presence of a dopant, to obtain an uniformly doped layer, as shown in FIG. 3e. According to one embodiment, the dopant type is N and the concentration is in the range of 5E+13 to 5E+14 atoms/cm³. According to one alternative embodiment, the upper layer 33 is the first epitaxial layer, and the layer 32 is obtained by heating the wafer to cause diffusion of N type carriers that have been ion implanted into the substrate to diffuse from the layer 31 to create the second layer 32 as a lower zone in the upper epitaxial layer 33. If the layer 32 is to obtained by diffusion, then sufficient dopant is implanted within layer 31, either by ion implantation or during the epi growth so that the final concentration of dopants within each layer, after all heating and fabrication steps are completed are within the ranges given herein. Thus, in one embodiment, only a single epi layer is grown, which becomes layer 33 and the other two layers are obtained as zone 31 within the substrate and zone 32 within the epi, respectively. Alternatively, the layers can be obtained by growing only two epi layers, 31, and 33, or 32 and 33. As a further alternative and in a preferred embodiment, there are three epi layers grown and each of the layers are obtained by epi growth to ensure a uniform concentration of dopant in each layer.

Figure 3F:
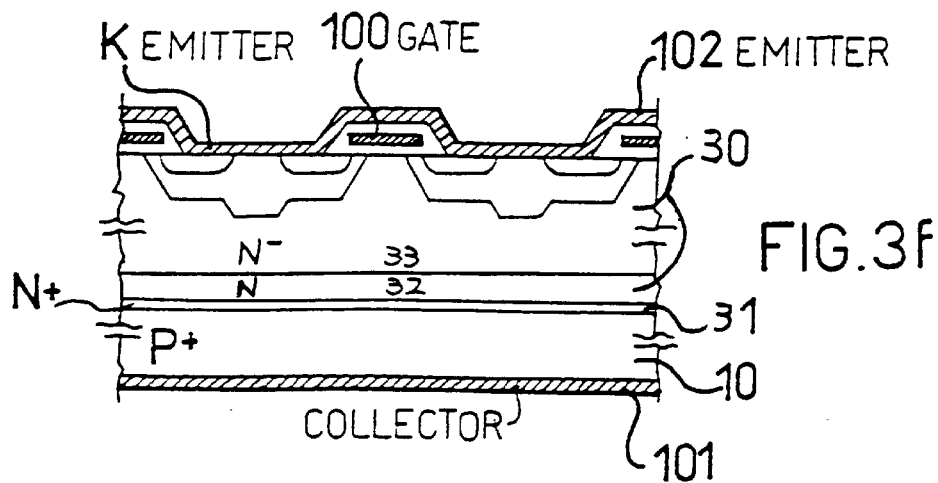

FIG. 3f illustrates a portion of the final structure of the device according to the present invention.

Figure 4:
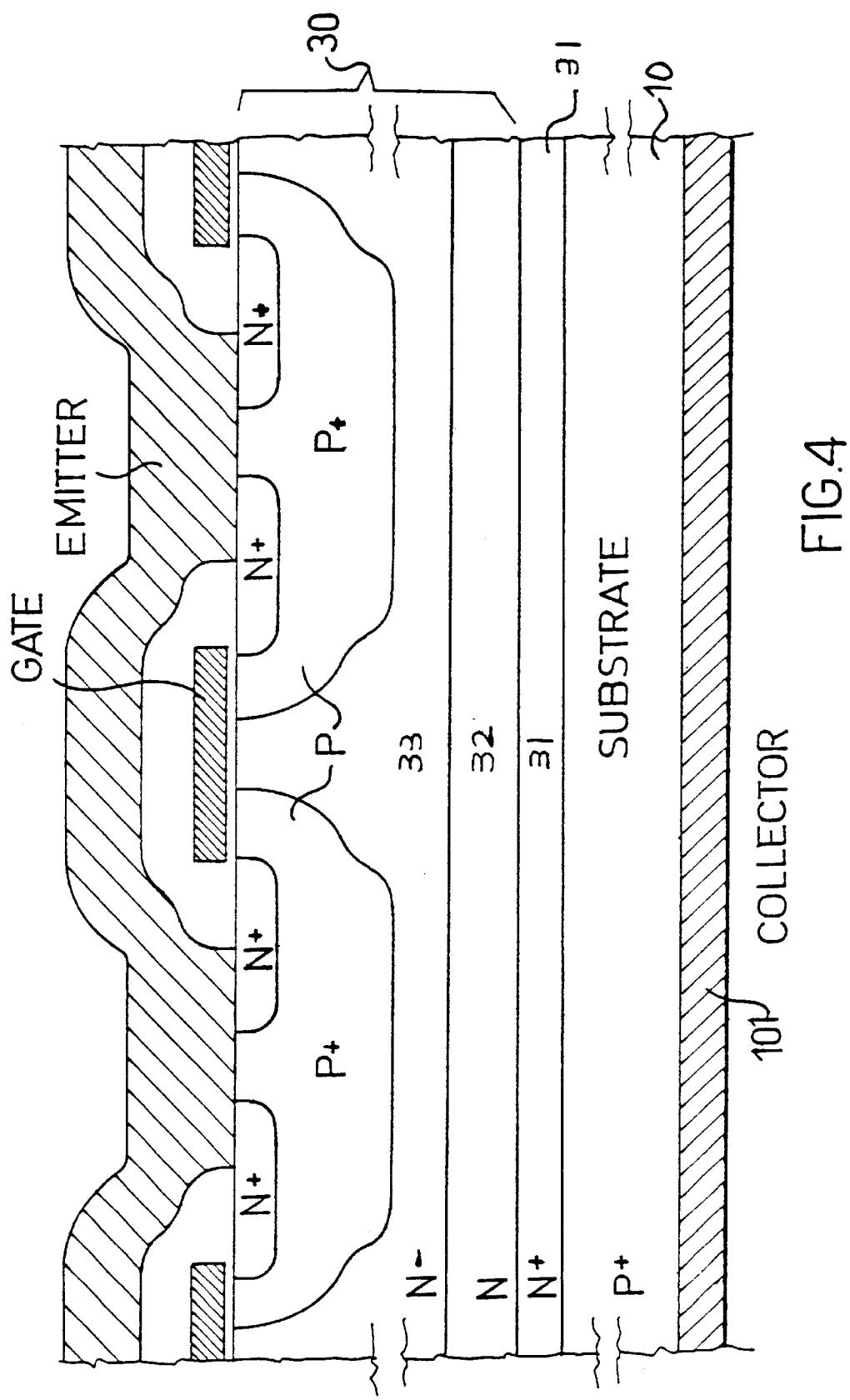
FIG. 4 shows an IGBT device according to the invention.

Referring to FIG. 4, the invention achieves the object of the invention by providing a semiconductor power device of the type that includes an insulated gate bipolar transistor device comprised of a semiconductor substrate 10 having a first type of conductivity and an overlying epitaxial layer 30 having a second type of conductivity, opposite from the first type, and whose junction to the substrate forms the base/emitter junction of the bipolar transistor. The layer adjacent to the junction, i.e., the layer 31, comprising a layer of a semiconductor material of the second type conductivity but having a higher dopant concentration than that of the epitaxial layer.

This device has an epitaxial layer 30 with conductivity of the second type having at least two zones of dopant concentration, namely a first lower zone 32 being adjacent to the layer 31 and provided with a higher dopant concentration and a second upper zone 33 being above and adjacent to the first zone 32 and provided with a lower concentration.

More particularly, the invention provides for the formation of an additional layer 32 whose concentration is intermediate between those of the N− layer 33 and the N+ layer 31.

Figure 1:
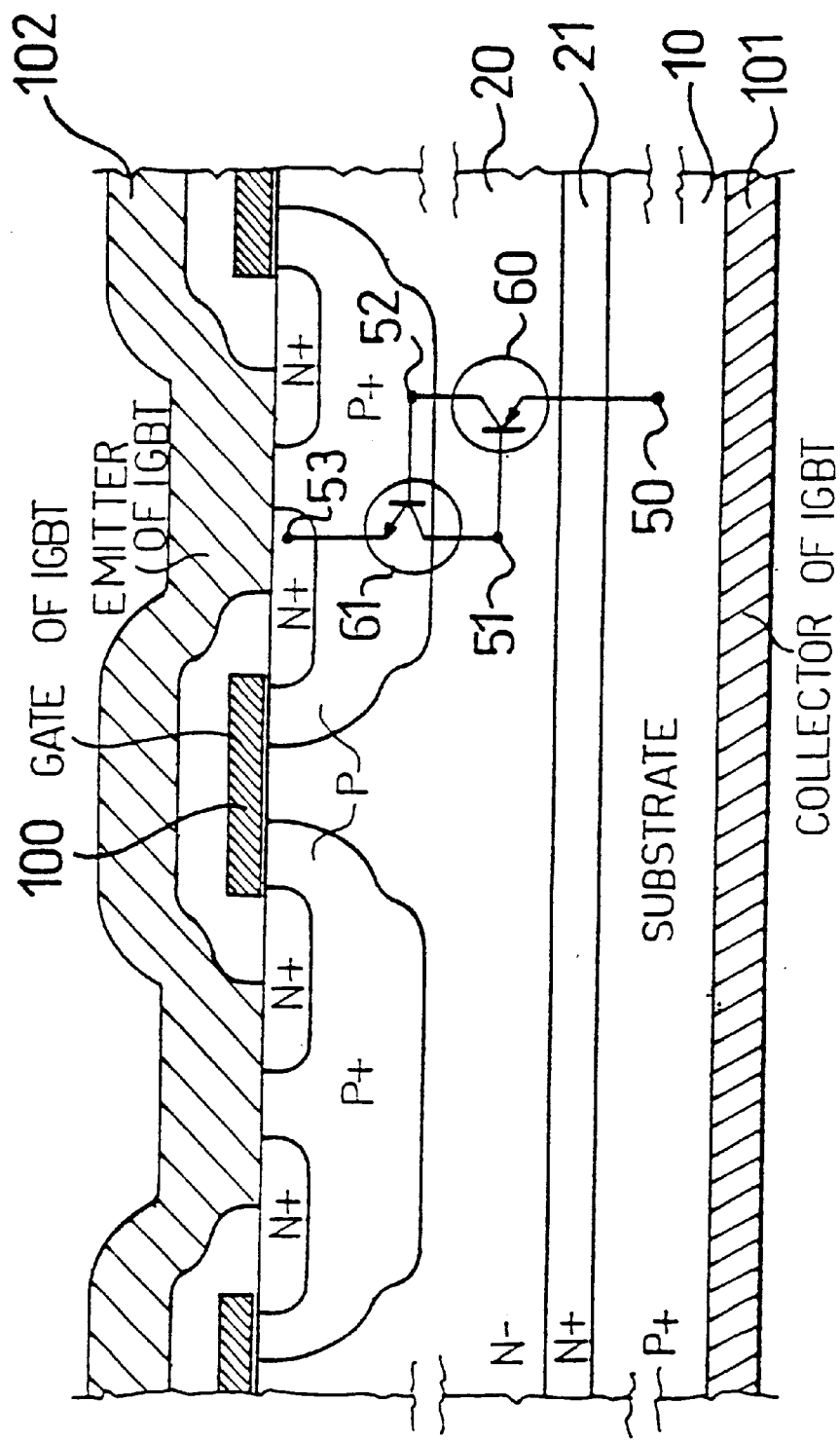
FIG. 1 shows an IGBT device according to the prior art.
Figure 2:
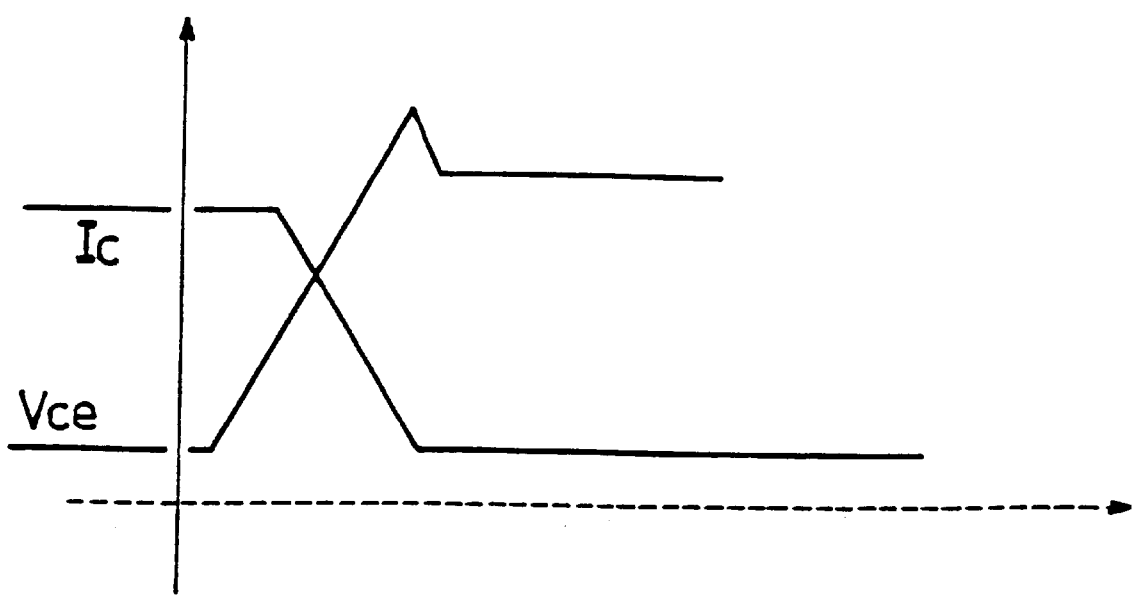
FIG. 2 shows the power dissipated by an IGBT.

This additional layer is located between the layer 33 of the device, which corresponds to the base 51 of the PNP transistor 60 in FIG. 1, and the buffer layer 31, which separates the base region from the substrate 10 constituting the emitter 50 of the PNP transistor 60.

Advantageously, this structure is directed to lower the electric field at the interface between the layers of the N− and N+ types corresponding to the layers 20 and 21 of the prior art and the layers 32 and 31 of this invention down to values approaching zero.

In this way, the layer 33 can be formed with a very high resistivity, that is less heavily doped.

Thus, the thickness of the layer 33 can be greatly reduced, which contributes toward holding the same device breakdown voltage as per relation (1).

In particular, the layer 33 with N− conductivity is formed by epitaxially growing silicon doped (N−) with phosphorus to a resistivity and thickness which are dictated by the voltage value BV of the device to be produced.

The device of this invention has a layer 32 at a different concentration, intermediate that of the layer 33 with N− polarity and that of the layer 31 with N+ polarity.

In the example illustrated, the phosphorus concentration in the N− layer 20 according to the prior art is at or above $1.5E+14$ atoms/cm$^3$, whereas in the layer 33 according to the invention, the phosphorus concentration is of approximately $9E+13$ atoms/cm$^3$ or less.

The phosphorus concentration in the layer 31 is approximately $1E+17$ atoms/cm$^3$, which is in the same range used in the prior art.

The additional layer 32 according to the invention has a phosphorus concentration of approximately $5E+14$ atoms/cm$^3$, in one embodiment. In other embodiments, it is in the range of $5E+15$ to $1E+14$, with $5E+14$ being preferred.

Figure 5:
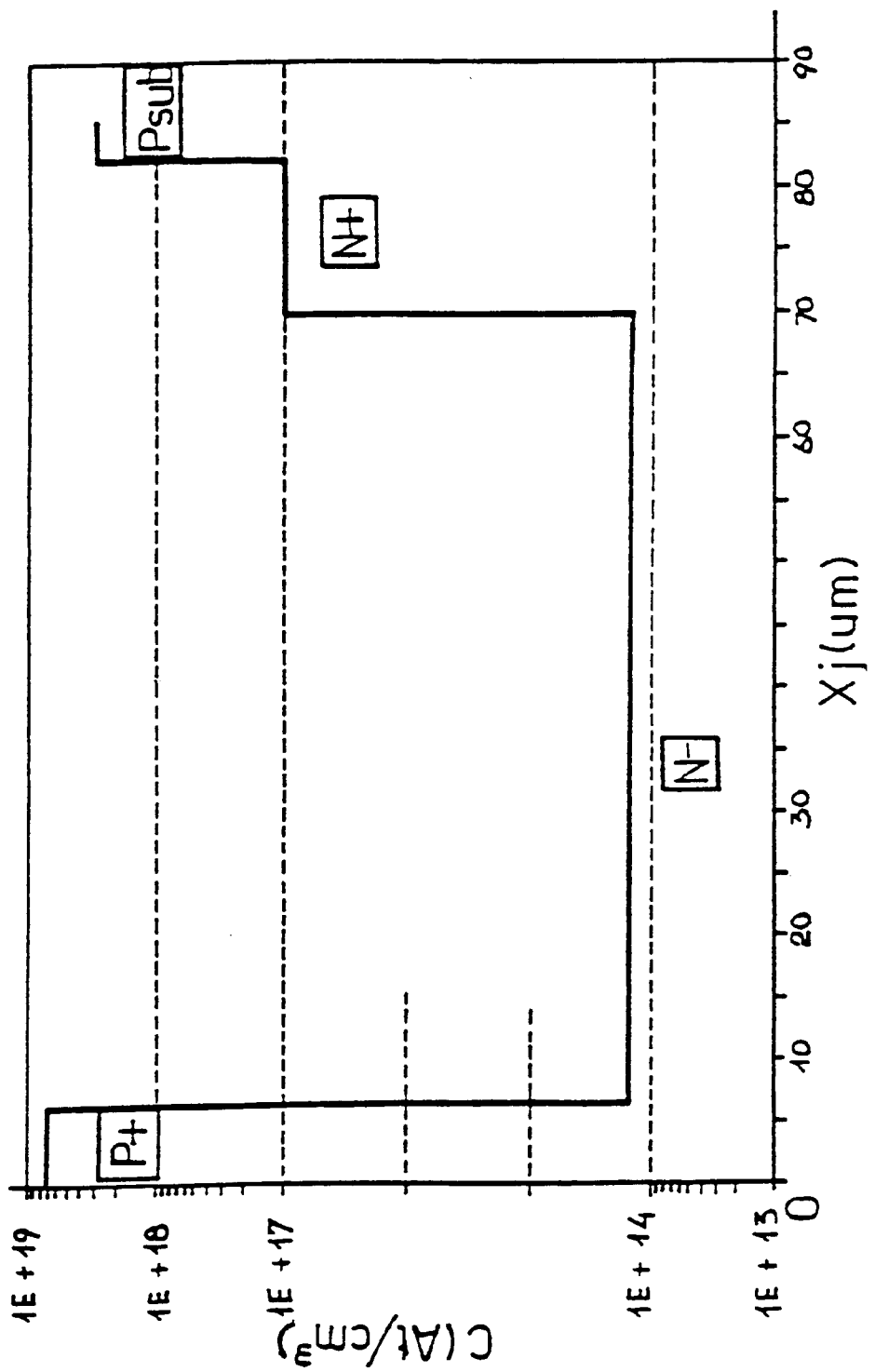
FIG. 5 shows the concentration provided in the prior art.
Figure 7:
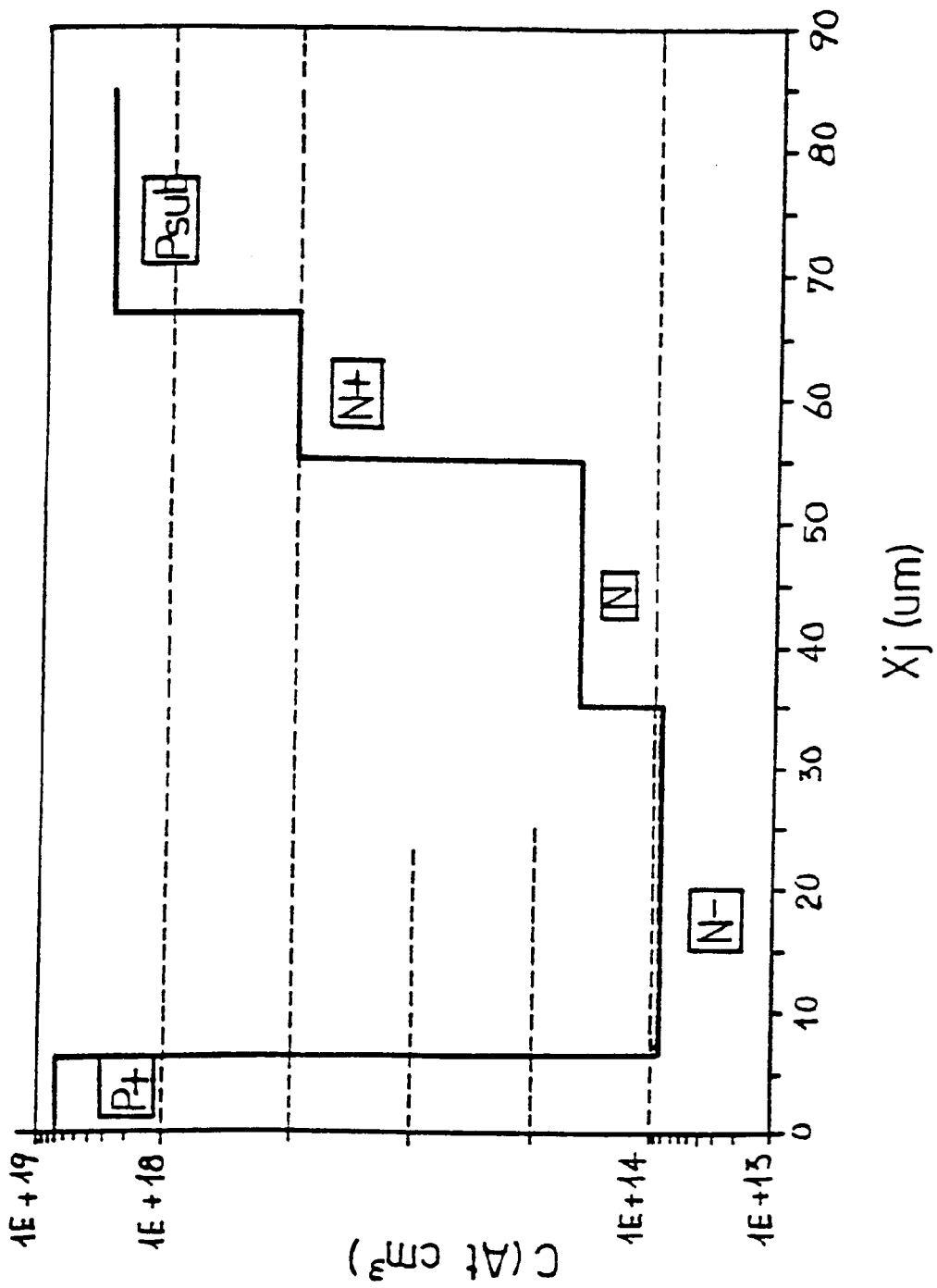
FIG. 7 shows the concentration provided by this invention.

The concentration profile of the prior art and of the present invention are plotted in FIG. 5 and FIG. 7, respectively.

Figure 6:
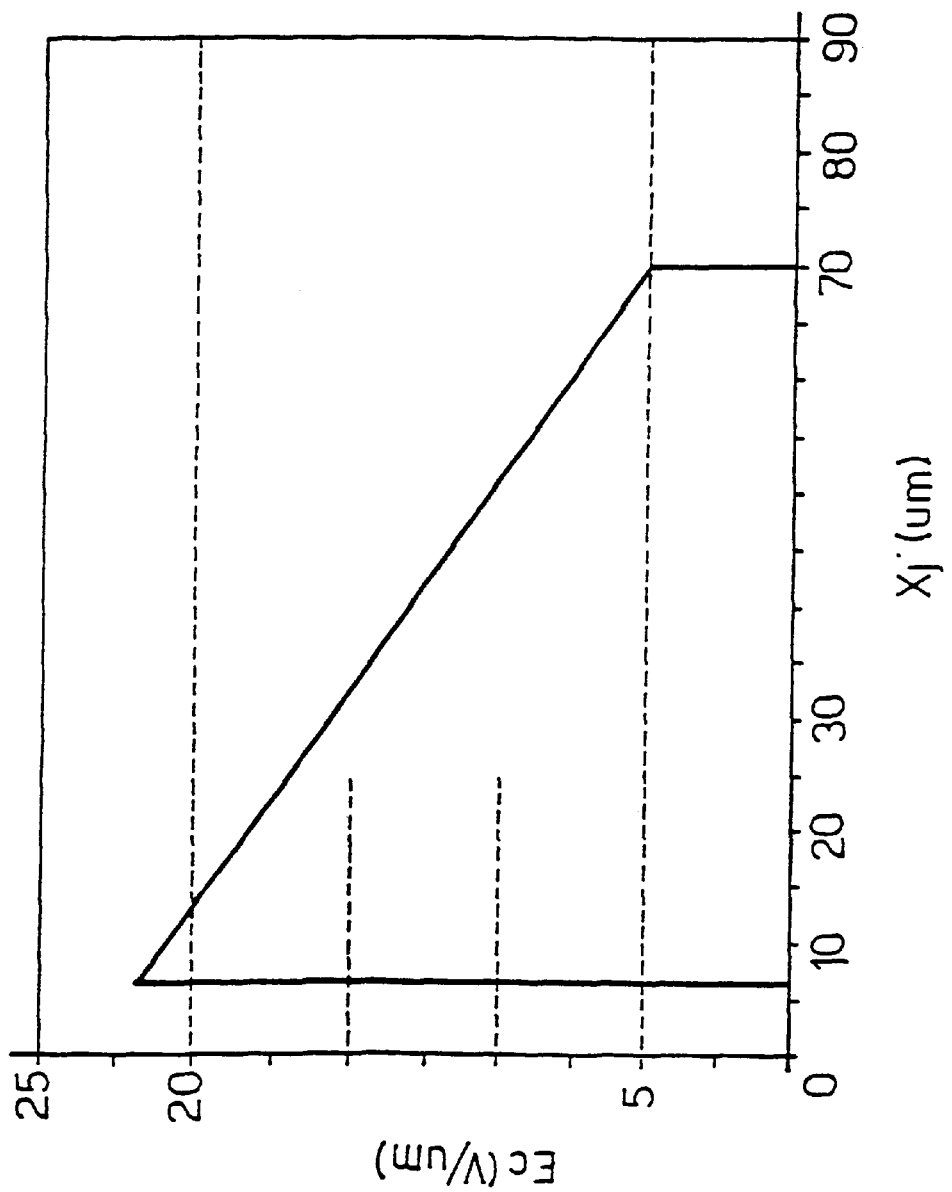
FIG. 6 shows the electric field upon breakdown according to the prior art.
Figure 8:
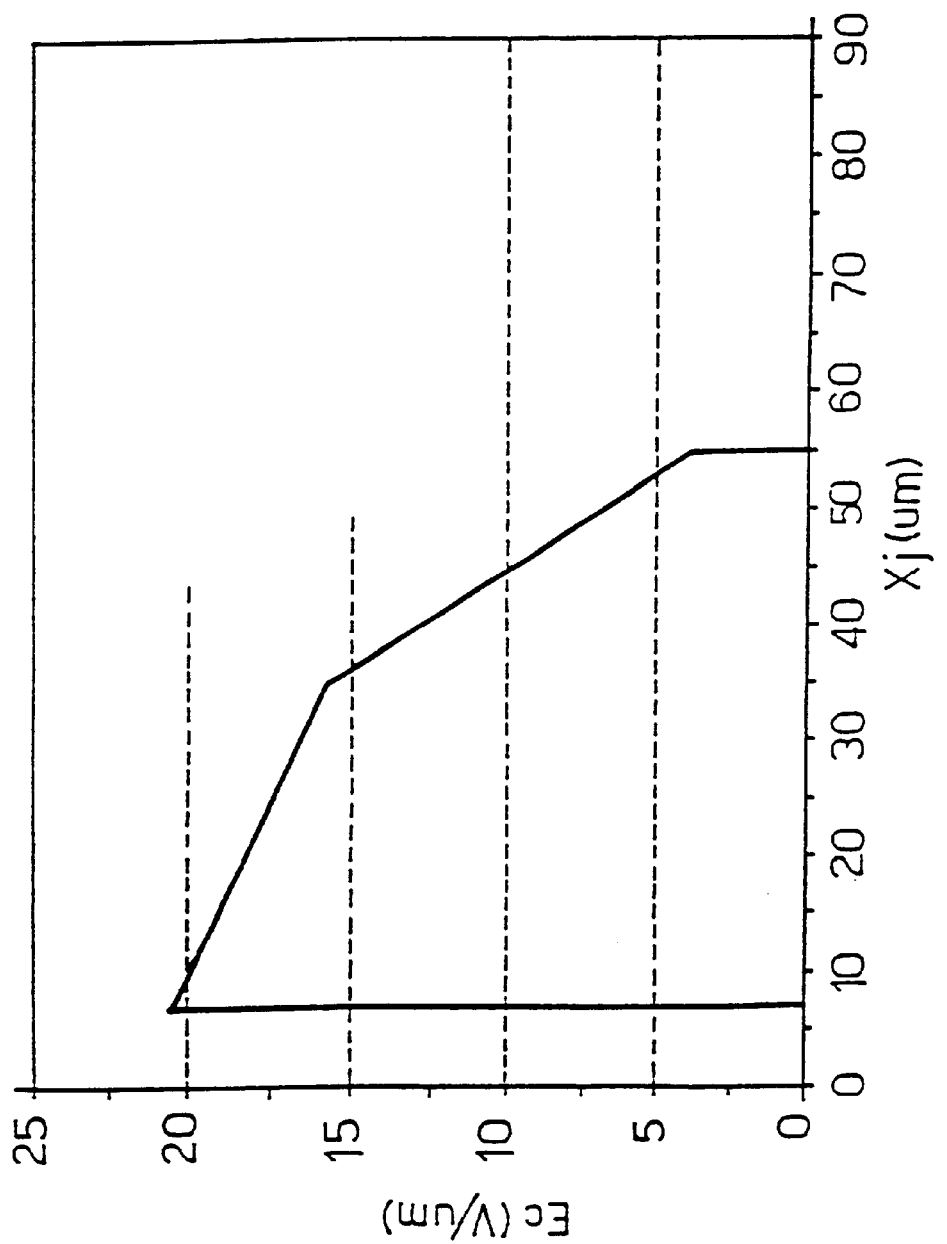
FIG. 8 shows the electric field upon breakdown according to this invention.

FIGS. 6 and 8 show the distribution of the electric field at breakdown voltage, respectively according to the prior art and this invention.

The values shown reveal on inspection that the inventive solution allows the overall thickness of the layer 30 to be reduced from about 70 microns to about 55 microns.

It can be shown that, for the same breakdown voltage, the combined thickness of the layer 33 and layer 32 is always smaller than that of the single layer 20 of the prior art.

Thus, it can be seen that with the solution provided by this invention, whereas the value of the electric field at the interface of the layers 20, 21 of the prior art was 5V/micron, the same electric field at the interface of the inventive layers 32, 31 is now 3V/micron, which brings out the improved ruggedness of the device of this invention.

Figure 9:
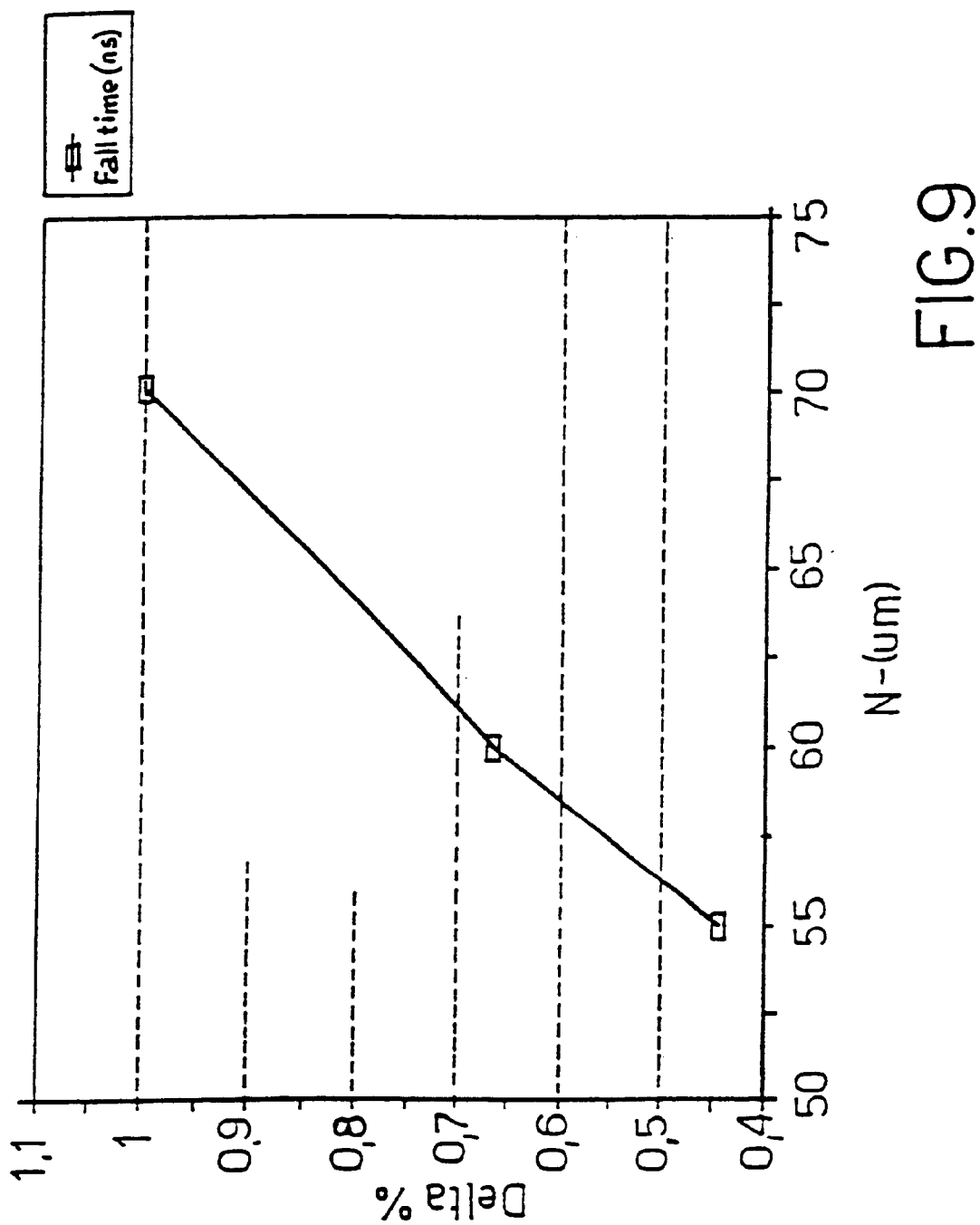
FIG. 9 is a plot of fall time vs. X (N−).

Of the advantages of this invention which result from the reduced thickness of the combined layer 30, FIG. 9 shows that the fall time value becomes, for a 55-micron thickness of the layer 30, 0.45 times the value to be obtained with the thickness of 70 microns of the prior art layer 20.

Figure 10:
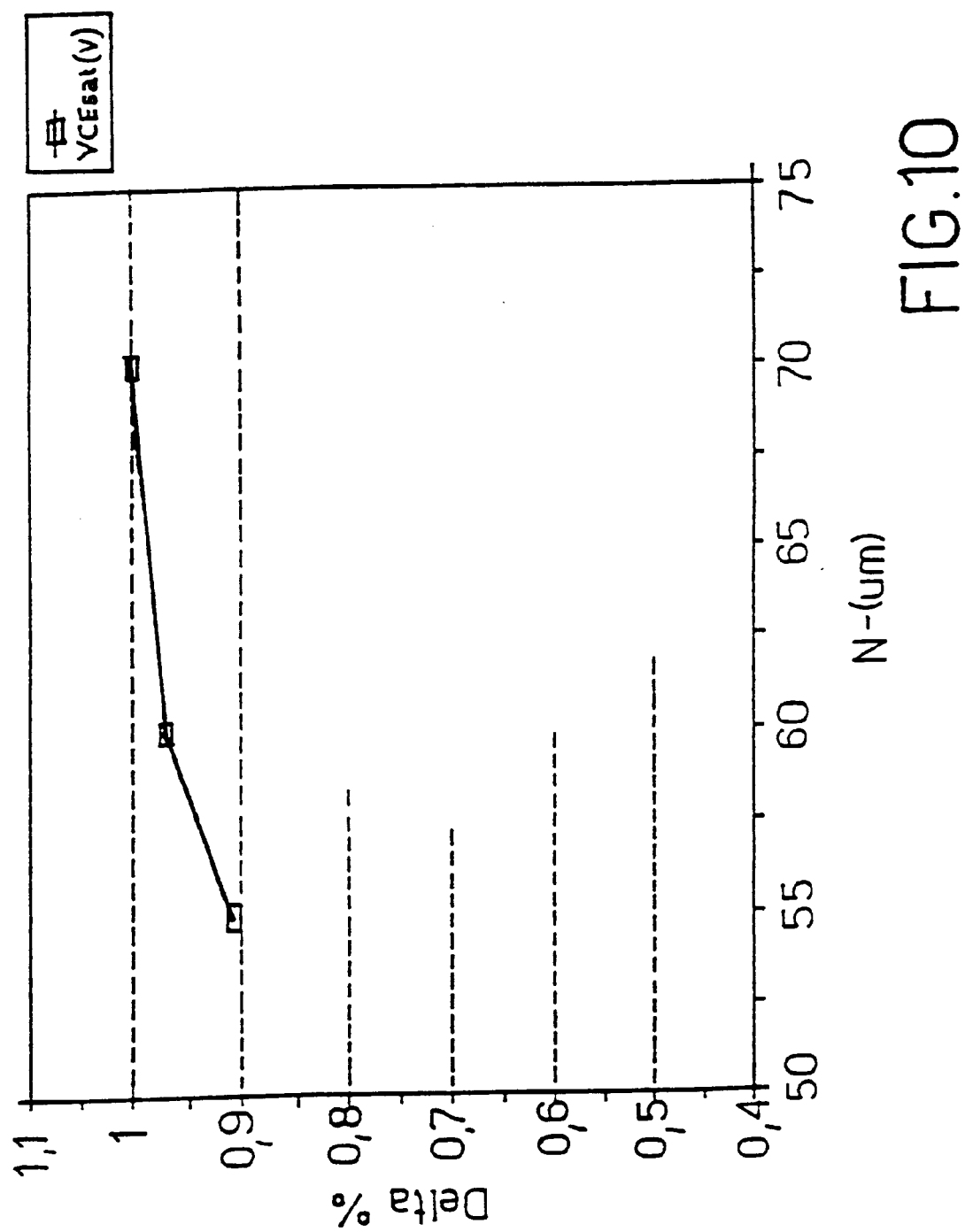
FIG. 10 is a plot of Vcesat vs. X (N−).

FIG. 10 shows that the output resistance, or better the corresponding value of Vcesat, also benefits from the reduced thickness of the layer 30. In fact, it can be seen that the value of Vcesat, for a layer 20 according to the prior art which is 70 microns thick, has been reduced by approximately ten percent using a thickness of 55 microns for the layer 30 as allowed for by this invention.

It can be seen that the improved parameters, Fall Time and Output Resistance, and ruggedness are, as previously mentioned, major merits of an IGBT type device, so that the device according to the invention will perform much better than prior art devices.

It should be emphasized that techniques are used to form the additional intermediate layer which are readily available from the processing of IGBT devices, such as those used to form the layer 20 in the prior art.

It should be further noted that the particular technique used to form the layers 33, 32, 31 is unimportant as to the results to be obtained. Particularly, layers 31 and 32 may be formed either by ion implantation or by epitaxial technique.

It will be apparent to the skilled person in the art that the structure described may also be obtained using a semiconductor substrate with conductivity of the N type by reversing the conductivities of all the successive overlying layers from those described, so that the resultant device will be operated with all the applied voltages reversed in polarity with respect to the device described hereinabove.

It should be understood that the sequence described to arrive at the inventive structure may be modified in many ways without departing from the scope of the invention.

What is claimed is:

1. A method for manufacturing an improved isolated gate bipolar transistor type device on a semiconductor substrate having a dopant of a first type conductivity, the method comprising the steps of:

forming a first layer overlying the semiconductor substrate by implanting ions of a dopant of a second type conductivity, which is opposite to the first type conductivity, said first layer having a first doping concentration; and forming an epitaxial layer over the first layer and having a dopant of the second type, said epitaxial layer having at least two zones wherein a first zone is coupled to the first layer and has a second doping concentration, and a second zone is coupled to the first zone and has a third doping concentration, said second doping concentration being greater than said third doping concentration but less than said first doping concentration.

2. The method of claim 1 wherein the first layer is formed by an epitaxial technique.

3. A method of making an insulated gate bipolar transistor on a semiconductor substrate having dopant of a first conductivity type, the method comprising:

forming a first layer overlying the semiconductor substrate by implanting ions of dopant of a second conductivity type, which is opposite to the first conductivity type, said first layer having a substantially uniform first doping concentration; and growing an epitaxial layer over the first layer and having dopant of the second conductivity type, said epitaxial layer having at least two zones wherein a first zone is coupled to the first layer and has a second doping concentration within a range of 1E+14 to 1E+15 atoms/cm$^3$, and a second zone is coupled to the first zone and has a third doping concentration, said second doping concentration being greater than said third doping concentration but less than said first doping concentration, wherein said first zone has a thickness not exceeding 20 microns.

4. The method of claim 3 wherein forming the first layer comprises growing the first layer using an epitaxial technique.

5. The method of claim 3 wherein forming the epitaxial layer includes forming the second zone to have the third doping concentration and wherein the third doping concentration is less than 1E+14 atoms/cm$^3$.

6. A method of making a semiconductor device of a type that includes an insulated gate bipolar transistor formed on a semiconductor substrate having dopant of a first conductivity type, the method comprising:

implanting an upper zone of the substrate with dopant of a second conductivity type;

growing an epitaxial layer with dopant of the second conductivity type over the semiconductor substrate, the epitaxial layer having an upper zone with a doping concentration less than a doping concentration of the upper zone of the substrate; and diffusing dopant of the second conductivity type from the upper zone of the substrate into a lower zone of the epitaxial layer, the lower zone of the epitaxial layer having a doping concentration greater than the doping concentration of the upper zone of the epitaxial layer and less than the doping concentration of the upper zone of the substrate.

7. The method of claim 6 wherein diffusing the dopant of the second conductivity type from the upper zone of the substrate into the lower zone of the epitaxial layer further comprises providing the doping concentration of the lower zone within a range of 1E+14 and 5E+16 atoms/cm$^3$.

8. The method of claim 6, further comprising providing the lower zone of the epitaxial layer with a thickness not exceeding 20 microns.

9. The method of claim 6, further comprising doping the upper zone of the epitaxial layer to a doping concentration that is less than 1E+14 atoms/cm$^3$.

10. A method of making a semiconductor device of a type that includes an insulated gate bipolar transistor on a semiconductor substrate having a dopant of a first conductivity type, the method comprising:

growing a first epitaxial layer having dopant of a second conductivity type over the semiconductor substrate, the first epitaxial layer having a first doping concentration;

growing a second epitaxial layer having dopant of the second conductivity type over the first epitaxial layer, the second epitaxial layer having a second doping concentration less than the first doping concentration; and diffusing dopant of the second conductivity type from the first epitaxial layer to a zone between the first and the second epitaxial layers, the zone having a doping concentration between the first and second doping concentrations.

11. The method of claim 10, further comprising providing the first and second epitaxial layers and the zone with a combined thickness of less than 55 microns.

12. The method of claim 10, further comprising providing an electric field at an interface between the first epitaxial layer and the zone with an operating value close to zero with respect to values of electric fields at other interfaces of the device.

13. The method of claim 10 wherein growing the second epitaxial layer further comprises doping the second epitaxial layer to a doping concentration less than 1E+14 atoms/cm$^3$.

14. The method of claim 10 wherein the zone comprises a lower zone of the second epitaxial layer.

15. The method of claim 10 wherein the zone has a thickness not exceeding 20 microns.

16. The method of claim 10 wherein diffusing dopant of the second conductivity type from the first epitaxial layer to form the zone further comprises doping the zone to a doping concentration between 1E+14 and 5E+16 atoms/cm$^3$.

17. A method of making a semiconductor device of a type that includes an insulated gate bipolar transistor on a semiconductor substrate having dopant of a first conductivity type, the method comprising:

implanting an upper zone of the substrate with dopant of a second conductivity type;

growing a first epitaxial layer having dopant of the second conductivity type over the semiconductor substrate, the first epitaxial layer having a first doping concentration;

growing a second epitaxial layer having dopant of the second conductivity type over the first epitaxial layer, the second epitaxial layer having a second doping concentration less than the first doping concentration; and diffusing dopant of the second conductivity type from the upper zone of the substrate to a lower zone of the first epitaxial layer, the lower zone of the first epitaxial layer having a doping concentration greater than the first doping concentration in an upper zone of the first epitaxial layer.

18. The method of claim 17, further comprising providing the second epitaxial layer and the upper and lower zones of the first epitaxial layer with a combined thickness of less than 55 microns.

19. The method of claim 17, further comprising providing an electric field at an interface between the upper and lower zones of the first epitaxial layer with an operating value close to zero with respect to values of electric fields at other interfaces of the device.

20. The method of claim 17 wherein growing the first epitaxial layer further comprises doping the first epitaxial layer to a doping concentration between 1E+14 and 5E+16 atoms/cm$^3$.

* * * * *

UNITED STATES PATENT AND TRADEMARK OFFICE
CERTIFICATE OF CORRECTION

PATENT NO.    : 6,271,061 B1
DATED         : August 7, 2001
INVENTOR(S)   : Ferruccio Frisina et al.

It is certified that error appears in the above-identified patent and that said Letters Patent is hereby corrected as shown below:

<u>Title page,</u>
Item [73], the Assignee should read -- Consorzio per la Ricerca sulla Microelettronica nel Mezzogiorno, Catania (IT) --.

Signed and Sealed this

Twenty-second Day of October, 2002

*Attest:*

*Attesting Officer*

JAMES E. ROGAN
*Director of the United States Patent and Trademark Office*